United States Patent
Ausserlechner

(10) Patent No.: US 9,103,868 B2
(45) Date of Patent: Aug. 11, 2015

(54) VERTICAL HALL SENSORS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 895 days.

(21) Appl. No.: 13/233,527

(22) Filed: Sep. 15, 2011

(65) Prior Publication Data
US 2013/0069640 A1 Mar. 21, 2013

(51) Int. Cl.
*G01R 33/06* (2006.01)
*G01R 33/07* (2006.01)

(52) U.S. Cl.
CPC .................................. *G01R 33/077* (2013.01)

(58) Field of Classification Search
CPC .............................. G01R 33/07; G01R 33/075
USPC ........................................................... 324/251
See application file for complete search history.

(56) References Cited

U.S. PATENT DOCUMENTS

| | | | |
|---|---|---|---|
| 3,823,354 A | 7/1974 | Janssen | |
| 4,141,026 A | 2/1979 | Bate et al. | |
| 5,747,995 A * | 5/1998 | Spies | 324/207.2 |
| 6,064,202 A | 5/2000 | Steiner et al. | |
| 6,184,679 B1 | 2/2001 | Popovic | |
| 6,727,563 B1 | 4/2004 | Hohe et al. | |
| 6,768,301 B1 | 7/2004 | Hohe et al. | |
| 7,425,821 B2 | 9/2008 | Monreal et al. | |
| 7,782,050 B2 | 8/2010 | Ausserlechner | |
| 7,872,322 B2 | 1/2011 | Schott | |
| 8,030,918 B2 | 10/2011 | Doogue et al. | |
| 8,093,891 B2 | 1/2012 | Rocznik et al. | |
| 8,114,684 B2 | 2/2012 | Rocznik | |
| 8,829,900 B2 | 9/2014 | Ausserlechner | |
| 8,896,303 B2 | 11/2014 | Ausserlechner et al. | |
| 2003/0102909 A1 | 6/2003 | Motz | |
| 2004/0212029 A1 | 10/2004 | Boor | |
| 2005/0258840 A1 | 11/2005 | Ausserlechner | |
| 2006/0097715 A1 | 5/2006 | Oohira | |
| 2009/0256559 A1 | 10/2009 | Ausserlechner | |
| 2010/0002821 A1 | 1/2010 | Hammerschmidt et al. | |
| 2010/0123458 A1 | 5/2010 | Schott | |
| 2010/0133632 A1 | 6/2010 | Schott | |
| 2012/0001279 A1 | 1/2012 | Hioka et al. | |
| 2012/0169329 A1 | 7/2012 | Hellwig | |
| 2013/0015853 A1 | 1/2013 | Raz et al. | |

(Continued)

FOREIGN PATENT DOCUMENTS

| | | |
|---|---|---|
| DE | 4141386 | 6/1993 |
| DE | 4302342 | 7/1993 |

(Continued)

OTHER PUBLICATIONS

Specification, Claims, Abstract, Drawings and Filing Receipt for U.S. Appl. No. 13/920,777, filed Jun. 18, 2013, inventors Ausserlechner et al.

(Continued)

*Primary Examiner* — Reena Aurora
(74) *Attorney, Agent, or Firm* — Eschweiler & Associates, LLC

(57) ABSTRACT

Embodiments relate to vertical Hall sensors for use with spinning current techniques. In an embodiment, a symmetric arrangement of two vertical Hall devices is used, in which all sense terminals of the Hall devices are used in all clock phases. Such a configuration can achieve better offset error suppression as compared with conventional solutions.

27 Claims, 2 Drawing Sheets

(56) References Cited

U.S. PATENT DOCUMENTS

| | | |
|---|---|---|
| 2013/0021026 A1 | 1/2013 | Ausserlechner |
| 2013/0069641 A1 | 3/2013 | Motz et al. |
| 2013/0127453 A1 | 5/2013 | Ausserlechner et al. |
| 2013/0214775 A1 | 8/2013 | Ausserlechner et al. |
| 2014/0028304 A1 | 1/2014 | Ausserlechner et al. |
| 2014/0084911 A1 | 3/2014 | Ausserlechner et al. |
| 2014/0210458 A1 | 7/2014 | Ausserlechner et al. |
| 2014/0210461 A1 | 7/2014 | Ausserlechner et al. |

FOREIGN PATENT DOCUMENTS

| | | |
|---|---|---|
| EP | 1438755 | 1/2005 |
| EP | 2071347 | 6/2009 |
| EP | 2192417 | 6/2010 |
| EP | 2546670 | 1/2013 |
| JP | 1251763 | 10/1989 |
| WO | WO 03/036733 A2 | 5/2003 |
| WO | WO 2004/025742 | 3/2004 |
| WO | WO2009050673 | 4/2009 |

OTHER PUBLICATIONS

Popovic, R.S., "Hall Devices for Magnetic Sensor Microsystems", *IEEE*, Transducers 1997, pp. 377-380.

Munter, A Low-offset Spinning-current Hall Plate, Sensors and Actuators, A21-A23, 1990. pp. 743-746.

Ausserlechner, Udo, *Limits of Offset Cancellation by the Principle of Spinning Current Hall Probe*, Infineon Technologies AG, 4 pages, Oct. 2004.

Vanha, Ralph, *Trench-Hall Devices*, Journal of Microelectromechanical Systems, vol. 9, No. 1, Mar. 2000, pp. 82-87.

De Jong, Paul C., *40.1 Smart Silicon Sensors—Examples of Hall-effect Sensors*, Sensors 2002 Proceedings of IEEE, 5 pages.

Application and File History for U.S. Appl. No. 13/559,197, filed Jul. 28, 2012 inventors Ausserlechner et al.

Application and File History for U.S. Appl. No. 13/627,468, filed Sep. 26, 2012, inventor Ausserlechner et al.

Application and File History for U.S. Appl. No. 13/753,190, filed Jan. 29, 2013 inventors Ausserlechner et al.

Application and File History for U.S. Appl. No. 13/621,336, filed Sep. 17, 2012, inventors Motz et al.

Office Action from Application DE 102013110633.1, dated May 27, 2014, 7 pgs.

Office Action from Application CN 2012103459284, dated Oct. 10, 2014, 14 pgs.

* cited by examiner

VERTICAL HALL SENSORS

TECHNICAL FIELD

The invention relates generally to magnetic field sensors and more particularly to vertical Hall sensors utilizing spinning current techniques.

BACKGROUND

The use of spinning current techniques with Hall sensors is known. Improved offset cancellation can be an advantage of spinning current techniques in Hall devices, with better results generally achieved when the Hall elements have 90-degree symmetry, e.g., square, cross, octagonal, etc., shapes.

Vertical Hall devices, however, are typically much less symmetric, often comprising strips with several contacts along the strip length. This makes vertical Hall devices generally less suitable for use with spinning current techniques. Solutions to this unsuitability have been proposed, such as forced symmetrization in which several vertical Hall devices are coupled together to form a symmetrical arrangement. Such an approach requires multiple individual vertical Hall devices, however, which can increase costs and space requirements.

Therefore, there is a need for improved vertical Hall sensors for use with spinning current techniques.

SUMMARY

Embodiments relate to vertical Hall sensors. In an embodiment, a Hall sensor comprises first and second Hall wells each comprising a plurality of contacts; and first and second amplifiers each coupled, in a first clock phase, to a first subset of the pluralities of contacts of the first and second Hall wells such that the first subset comprises signal contacts and a second subset of the pluralities of contacts comprises supply contacts and, in a second clock phase, to the second subset such that the first subset comprises supply contacts, the second subset comprises signal contacts and all of the supply contacts in the first clock phase comprise signal contacts in the second clock phase.

In an embodiment, a method comprises, in a first clock phase: coupling a first plurality of Hall contacts to first and second amplifiers, and using a second plurality of Hall contacts as supply contacts; and, in a second clock phase: coupling all of the second plurality of Hall contacts to the first and second amplifiers.

In an embodiment, Hall sensor circuitry comprises a first Hall well comprising a first plurality of contacts; a second Hall well comprising a second plurality of contacts; a first amplifier coupled to a first one of the first plurality of contacts and a first one of the second plurality of contacts in a first clock phase and to a second one of the first plurality of contacts and a second one of the second plurality of contacts in a second clock phase; and a second amplifier coupled to a third one of the first plurality of contacts and to a third one of the second plurality of contacts in the first clock phase and to a fourth one of the first plurality of contacts and a fourth one of the second plurality of contacts in the second clock phase, wherein the second and fourth ones of each of the first and second pluralities of contacts comprise signal contacts in the first clock phase, and the first and third ones of each of the first and second pluralities of contacts comprise signal contacts in the second clock phase.

BRIEF DESCRIPTION OF THE DRAWINGS

The invention may be more completely understood in consideration of the following detailed description of various embodiments of the invention in connection with the accompanying drawings, in which.

Figure 1:
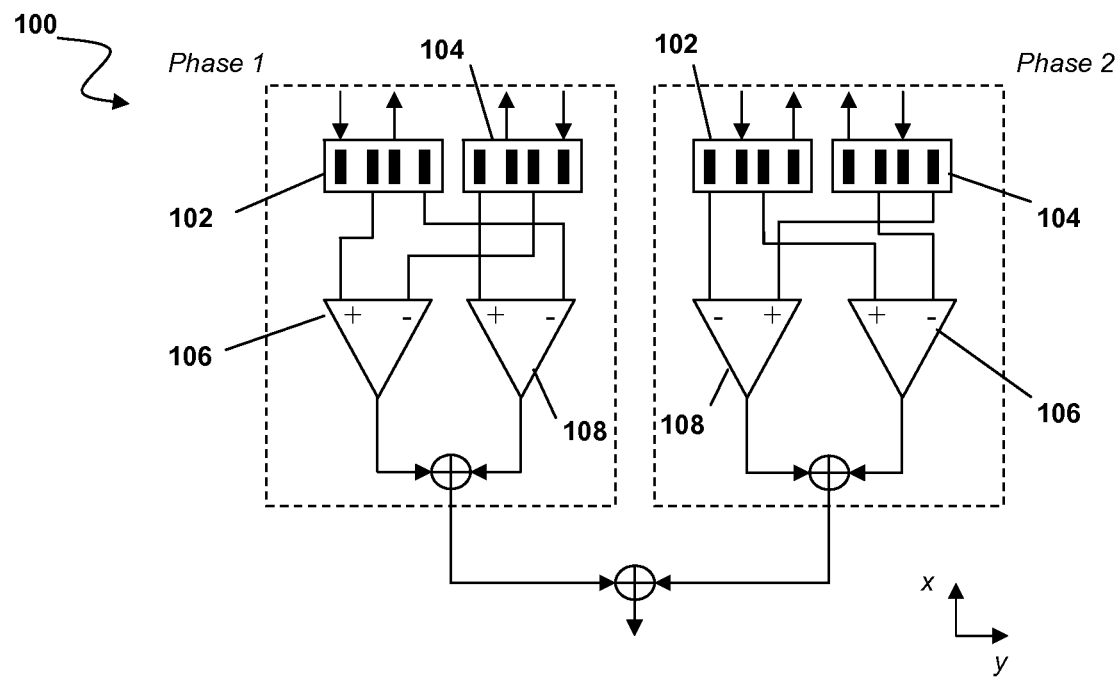
FIG. 1 is a block diagram of a Hall sensor circuit according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to vertical Hall sensors for use with spinning current techniques. In an embodiment, a symmetric arrangement of two vertical Hall devices is used, in which all sense terminals of the Hall devices are used in all clock phases. Such a configuration can achieve better offset error suppression as compared with conventional solutions.

Referring to FIG. 1, a signal processing diagram 100 of a spinning Hall sensor comprises a Phase 1 portion and a Phase 2 portion in an embodiment. In an embodiment, Phase 1 and Phase 2 comprise the same circuitry switched into different couplings and configurations in different clock phases of the spinning Hall sensor, though for convenience herein the phases will be described separately as depicted in FIG. 1. Those skilled in the art, however, will appreciate Phase 1 and Phase 2 in the context of a spinning Hall sensor sampled in different clock phases. Additionally, the wells and contacts as depicted are indicative of approximate layouts viewed from the top onto a surface of a semiconductor wafer, for example, and are not necessarily to scale, while other elements comprise schematic representations for convenience, to symbolize how the various devices and elements can be coupled in embodiments. Referring to the orientation illustrated in FIG. 1, the Hall sensor generally detects magnetic fields in the x-direction.

Each phase comprises first and second Hall wells 102 and 104 and first and second amplifiers 106 and 108. Each Hall well 102 and 104 comprises four contacts. In Phase 1, first amplifier 106 is coupled to contact 2 of well 102 and contact 3 of well 104, and second amplifier 108 is coupled to contact 1 of well 104 and contact 4 of well 102. In Phase 2, first amplifier 106 is coupled to contact 3 of well 102 and contact 2 of well 104, while second amplifier 108 is coupled to contact 1 of well 102 and contact 4 of well 104.

First and second amplifiers 106 and 108 operate at different common mode potentials. The common mode of first amplifier 106 is defined by the position of contact 2 of well 102 between contacts 1 and 3. For example, if contact 2 is exactly halfway between contacts 1 and 3, then the common mode is about half of the supply voltage. The common mode voltage is only approximately half of the supply voltage because well 102 is not perfectly symmetric with respect to contact 2. The common mode voltage of second amplifier 108 is defined by the potential of contact 1 of well 104, which is in turn defined by the ratio of the distance between contacts 1 and 2 over the thickness of well 104. It is also assumed that well 102 is symmetrical between the second and third contacts.

Figure 2:
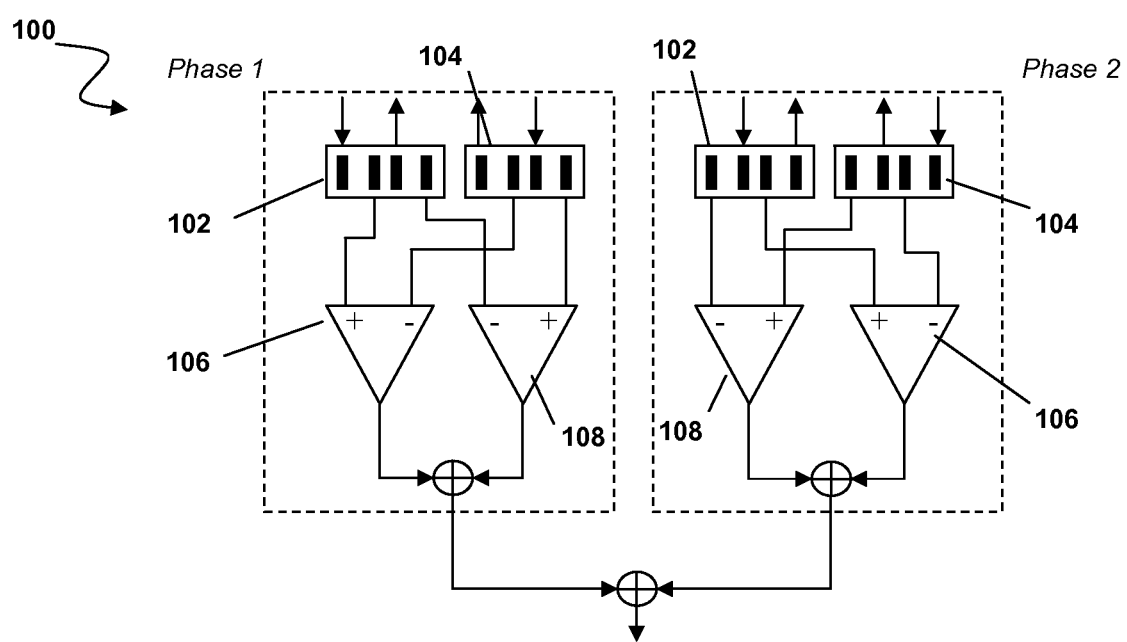
FIG. 2 is a block diagram of a Hall sensor circuit according to an embodiment.

Additionally, the common mode voltage of amplifier 106 in Phase 1 is identical to its common mode voltage in Phase 2; likewise, the common mode voltage of amplifier 108 is identical in Phases 1 and 2. This is true in embodiments if both amplifiers 106 and 108 are identical and symmetric with respect to their centers, between contacts 2 and 3 of each. FIG. 2 depicts another embodiment, in which operating conditions of phases 1 and 2 of circuit 100 of FIG. 1 are altered.

In embodiments, the polarity of supply and sense terminals, represented in the drawings by the arrows and entering and leaving wells 102 and 104, can be reversed in each clock phase such that third and fourth clock phases are created. It is also possible to alternate the spinning current schemes of FIGS. 1 and 2, e.g., by implementing Phase 1, then Phase 2, of FIG. 1 followed by Phase 1 and Phase 2 of FIG. 2, and then repeating. Such an approach can provide lower residual offsets because the offset contributions of amplifiers 106 and 108 and the switches that implement that various connections between the contacts and the inputs of amplifiers 106 and 108 can depend on the common mode voltage. Further, amplifiers 106 and 108 can be exchanged or rotated after one or more spinning cycles. Also, the inverting and non-inverting inputs of amplifier 108 can be reversed, with the signal processing, i.e., subtraction of amplifier outputs instead of addition as depicted in FIGS. 1 and 2. Other processing adjustments can be made, for example if the polarities of the supply and/or sense terminals are reversed.

In yet another embodiment, circuit 100 can comprise four wells. In such an embodiment, the signals of the wells can be added in Phase 1. In Phase 2, the connections of the first and third wells are exchanged, as are those of the second and fourth, with the outputs added or averaged by related circuitry.

Each of wells 102 and 104 can be supplied by either a voltage or a current source, with each well 102, 104 having its own source or both being coupled to a single source, in various embodiments. If wells 102, 104 are supplied by separate sources, it can be advantageous in embodiments to periodically swap the sources between wells 102, 104.

Relatedly, the signals of Hall device 100 can be voltage or current. In voltage embodiments, amplifiers 106 and 108 can be coupled to wells 102 and 104 as depicted in FIG. 1. In current embodiments, amplifiers 106 and 108 can be coupled, at their inputs, as depicted in FIG. 1, but with their outputs controlling current sources that inject feedback currents into one or both output contacts of wells 102 and 104. A control loop comprising a Hall device, amplifier and current source can be configured for adjusting the injected feedback current with proper sign and magnitude so as to achieve zero voltage between the inverting and non-inverting inputs of the amplifier. In such an embodiment, the extracted Hall signal is not a voltage but a current, the feedback current. The feedback loop provides a way to copy this feedback current and provide it at an output for further signal processing.

Thus, there are four supply and signal combinations in embodiments: (1) current in, current out; (2) current in, voltage out; (3) voltage in, current out; and (4) voltage in, voltage out.

Figure 3:
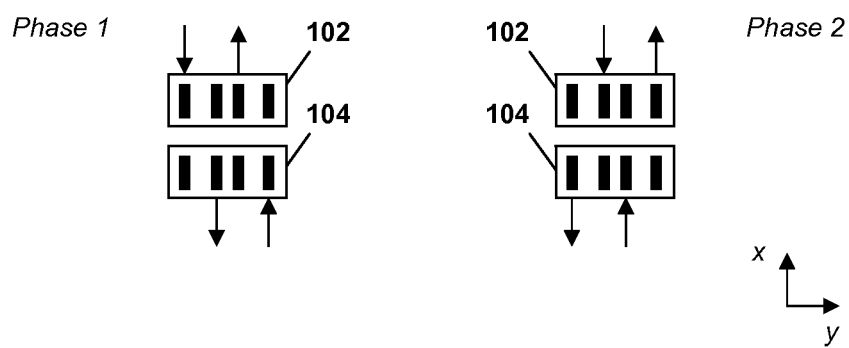
FIG. 3 is a block diagram of Hall wells according to an embodiment.

Modifications can be made in embodiments to address thermoelectric voltages, as embodiments in which wells 102 and 104 are arranged adjacent one another along a single axis can be prone to thermoelectric offset voltages if the temperature has a gradient in the y-direction (refer to FIG. 1). In one embodiment, for example, wells 102 and 104 can be arranged adjacent one another in the x-direction instead, as depicted in FIG. 3.

Without rearranging wells 102 and 104, certain embodiments can be more robust with respect to linear gradients because certain errors can be canceled in each phase, depending upon on the configuration. For example, the embodiment of FIG. 2 can be more robust with respect to linear gradients than the embodiment of FIG. 1, given the contact couplings in Phases 1 and 2 and cancelation of thermoelectric errors related thereto.

Internal heat sources, or heat generated by the Hall devices themselves, can also be a source of thermoelectric errors. Internal heat sources are generally synchronous to the spinning current sequence. FIG. 1, therefore, generally has good cancelation of such errors because the inverting and non-inverting inputs of amplifiers 106 and 108 are coupled to sense terminals that are symmetric to internal heat sources.

Given the aforementioned advantages of each of the embodiments of FIGS. 1 and 2, it can be advantageous, as previously mentioned in another context, to alternate the configurations of FIGS. 1 and 2 in sequential phases in order to realize the advantages of each.

Embodiments thereby provide improved offset suppression and/or cancelation by utilizing all of the sense terminals in each clock phase. Other advantages with respect to conventional approaches can also be realized.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A Hall sensor comprising:
   first and second Hall wells each comprising a plurality of contacts; and first and second amplifiers, wherein:
 each of the first and second amplifiers is coupled, in a first clock phase, to a first subset of the pluralities of contacts of the first and second Hall wells, wherein the first and second amplifiers are each connected to a contact of the first Hall well and also a contact of the second Hall well, such that the first subset comprises signal contacts, and;
 a second subset of the pluralities of contacts comprises supply contacts in the first clock phase; and
 in a second clock phase, the first and second amplifiers are coupled to the second subset such that the second subset comprises signal contacts, wherein the first and second amplifiers are each connected to a contact of the first Hall well and also a contact of the second Hall well; and
 in the second clock phase, the first subset comprises supply contacts.

2. The Hall sensor of claim 1, further comprising switching circuitry configured to selectively couple the first and second amplifiers to the first and second subsets in the first and second clock phases.

3. The Hall sensor of claim 1, wherein each of the pluralities of contacts comprises four contacts such that the first Hall well comprises first, second, third and fourth contacts and the second Hall well comprises first, second, third and fourth contacts.

4. The Hall sensor of claim 3, wherein the first, second, third and fourth contacts of the first Hall well are arranged as a vertical Hall effect sensor and the first, second, third and fourth contacts of the second Hall well are arranged as a vertical Hall effect sensor.

5. The Hall sensor of claim 4, wherein the first and second vertical Hall effect sensors are arranged collinearly.

6. The Hall sensor of claim 4, wherein the first and second vertical Hall effect sensors are arranged parallel to one another.

7. The Hall sensor of claim 4, wherein, in the first clock phase, the first subset comprises the second and fourth contacts of the first Hall well and the first and third contacts of the second Hall well and the second subset comprises the first and third contacts of the first Hall well and the second and fourth contacts of the second Hall well, and in the second clock phase, the first subset comprises the second and fourth contacts of the first Hall well and the first and third contacts of the second Hall well and the second subset comprises the first and third contacts of the first Hall well and the second and fourth contacts of the second Hall well.

8. The Hall sensor of claim 7, wherein in the first clock phase:
 in the first Hall well: the first contact comprises an input supply contact, the second contact comprises a signal contact coupled to a non-inverting input of the first amplifier, the third contact comprises an output supply contact, and the fourth contact comprises a signal contact coupled to an inverting input of the second amplifier; and
 in the second Hall well: the first contact comprises a signal contact coupled to a non-inverting input of the second amplifier, the second contact comprises an output supply contact, the third contact comprises a signal contact coupled to an inverting input of the first amplifier and the fourth contact comprises an input supply contact.

9. The Hall sensor of claim 7, wherein in the second clock phase:
 in the first Hall well: the first contact comprises a signal contact coupled to an inverting input of the second amplifier, the second contact comprises an input supply contact, the third contact comprises a signal contact coupled to a non-inverting input of the first amplifier, and the fourth contact comprises an output supply contact; and
 in the second Hall well: the first contact comprises an output supply contact, the second contact comprises a signal contact coupled to an inverting input of the first amplifier, the third contact comprises an input supply contact and the fourth contact comprises a signal contact coupled to a non-inverting input of the second amplifier.

10. The Hall sensor of claim 7, wherein in the first clock phase:
 in the first Hall well: the first contact comprises an input supply contact, the second contact comprises a signal contact coupled to a non-inverting input of the first amplifier, the third contacts comprises an output supply contact, and the fourth contact comprises a signal contact coupled to an inverting input of the second amplifier; and
 in the second Hall well: the first contact comprises an output supply contact, the second contact comprises a signal contact coupled to an inverting input of the first amplifier, the third contact comprises an input supply contact and the fourth contact comprises a signal contact coupled to a non-inverting input of the second amplifier.

11. The Hall sensor of claim 7, wherein in the second clock phase:
 in the first Hall well: the first contact comprises a signal contact coupled to an inverting input of the second amplifier, the second contact comprises an input supply contact, the third contact comprises a signal contact coupled to a non-inverting input of the first amplifier and the fourth contact comprises an output supply contact; and
 in the second Hall well: the first contact comprises a signal contact coupled to a non-inverting input of the second amplifier, the second contact comprises an output supply contact, the third contact comprises a signal contact coupled to an inverting input of the first amplifier and the fourth contact comprises an input supply contact.

12. The Hall sensor of claim 1, wherein the first Hall well is configured for a first current flow direction and the second Hall well is configured for a second current flow direction, the first current flow direction being the opposite of the second current flow direction.

13. The Hall sensor of claim 1, wherein the first and second subsets comprise a totality of the pluralities of contacts.

14. The Hall sensor of claim 1, further comprising circuitry coupled to outputs of the first and second amplifiers and configured to provide a sum of the outputs.

15. The Hall sensor of claim 1, wherein the first amplifier has a first common mode voltage and the second amplifier has a second common mode voltage different from the first common mode voltage.

16. A method comprising:
 in a first clock phase:
  coupling a first subset of Hall contacts to each of first and second amplifiers as signal contacts, wherein the first subsets of Hall contacts each comprise contacts in both a first Hall well and a second Hall well; and
  using a second subset of Hall contacts as supply contacts, wherein the second subsets of Hall contacts comprise contacts in both the first Hall well and the second Hall well; and in a second clock phase:
coupling all of the second subset of Hall contacts to the first and second amplifiers as signal contacts.

17. The method of claim 16, further comprising, in the second clock phase, using the first subsets of Hall contacts as supply contacts.

18. The method of claim 16, wherein the first and second subsets of Hall contacts comprise a totality of available Hall contacts.

19. The method of claim 16, further comprising providing a Hall sensor comprising a first vertical Hall effect device having a first Hall well and a second vertical Hall device having a second Hall well, each of the first and second Hall effect devices comprising contacts of both the first and second subsets, the first and second subsets being distinct.

20. The method of claim 16, further comprising adding output signals of the first and second amplifiers.

21. The method of claim 20, further comprising adding the output signals of the first and second amplifiers from the first and second clock phases.

22. The method of claim 20, wherein a common mode potential of the first amplifier is different from a common mode potential of the second amplifier in at least one of the first or second clock phases.

23. Hall sensor circuitry comprising:
a first Hall well comprising a first plurality of contacts;
a second Hall well comprising a second plurality of contacts;
a first amplifier coupled to a first one of the first plurality of contacts and a first one of the second plurality of contacts in a first clock phase and to a second one of the first plurality of contacts and a second one of the second plurality of contacts in a second clock phase; and
a second amplifier coupled to a third one of the first plurality of contacts and to a third one of the second plurality of contacts in the first clock phase and to a fourth one of the first plurality of contacts and a fourth one of the second plurality of contacts in the second clock phase,
wherein the second and fourth ones of each of the first and second pluralities of contacts comprise supply contacts in the first clock phase, and the first and third ones of each of the first and second pluralities of contacts comprise supply contacts in the second clock phase.

24. The Hall sensor circuitry of claim 23, further comprising circuitry coupled to the first and second amplifiers to sum output signals of the first and second amplifiers.

25. The Hall sensor circuitry of claim 23, wherein the first and second Hall wells are spaced apart from one another along an axis.

26. The Hall sensor circuitry of claim 23, wherein the first Hall well is arranged along a first axis and the second Hall well is arranged along a second axis, the first and second axes being parallel.

27. The Hall sensor circuitry of claim 23, wherein the first and second amplifiers are configured to have different common mode voltages.

* * * * *